United States Patent
Fackenthal et al.

(10) Patent No.: US 8,934,291 B2
(45) Date of Patent: Jan. 13, 2015

(54) INTERLEAVED ARRAY ARCHITECTURE

(75) Inventors: Richard E. Fackenthal, Carmichael, CA (US); Ferdinando Bedeschi, Biassono (IT); Meenatchi Jagasivamani, Fairfield, CA (US); Enzo M. Donze, Agrate Brianza (IT)

(73) Assignee: Intel Corporation, Santa Clara, CA (US)

( * ) Notice: Subject to any disclaimer, the term of this patent is extended or adjusted under 35 U.S.C. 154(b) by 540 days.

(21) Appl. No.: 11/901,333

(22) Filed: Sep. 17, 2007

(65) Prior Publication Data
US 2009/0073751 A1 Mar. 19, 2009

(51) Int. Cl.
  *G11C 11/00* (2006.01)
  *G11C 8/04* (2006.01)

(52) U.S. Cl.
  CPC .......... *G11C 8/04* (2013.01)
  USPC ......................... 365/163; 365/148

(58) Field of Classification Search
  CPC ............................................. G11C 11/00
  USPC ........ 365/46, 94, 100, 113, 148, 163; 438/29, 438/95, 96, 166, 365, 482, 486, 597; 257/2–5, 296, E31.047, E27.006
  See application file for complete search history.

(56) References Cited

U.S. PATENT DOCUMENTS

| | | | | |
|---|---|---|---|---|
| 2007/0285969 A1* | 12/2007 | Toda et al. | ...... | 365/148 |
| 2007/0285970 A1* | 12/2007 | Toda et al. | ...... | 365/148 |
| 2007/0285971 A1* | 12/2007 | Toda et al. | ...... | 365/148 |
| 2008/0002455 A1* | 1/2008 | Toda et al. | ...... | 365/148 |
| 2008/0002456 A1* | 1/2008 | Toda et al. | ...... | 365/148 |
| 2008/0002457 A1* | 1/2008 | Toda et al. | ...... | 365/148 |

* cited by examiner

*Primary Examiner* — Harry W Byrne
(74) *Attorney, Agent, or Firm* — Trop, Pruner & Hu, P.C.

(57) ABSTRACT

A partition may be made up of two planes of memory cells in a phase change memory. These planes may be configured so that they are not adjacent to one another. In some embodiments, this may mean that the adjacent planes may share sensing circuits, reducing the overall size of the memory array. In addition, by using non-adjacent planes to make up a partition, the planes may be spaced in a way which reduces resistance of power conveying lines. This may mean that smaller sized lines may be used, further reducing the size of the overall array.

10 Claims, 2 Drawing Sheets

INTERLEAVED ARRAY ARCHITECTURE

BACKGROUND

This relates generally to bit alterable crosspoint memories.

Phase change memory devices are one type of bit alterable crosspoint memory. A phase change memory uses phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

A phase change memory may include an array of memory cells. Each cell may include a phase change memory element, as well as one or more other devices such as a select device. A tile may be a group of phase change memory cells on a series of adjacent word and bitlines. For example, in one embodiment, a tile may have a million cells on a thousand consecutive rowlines and a thousand consecutive bitlines. A plane is made up of eight tiles in accordance with one embodiment. However, a plane may include any number of tiles greater than one.

In accordance with one embodiment, each tile is capable of providing 8 inputs or outputs. Thus, in such an example, a plane is capable of 64 inputs and outputs. Each plane may have sensing circuits associated with a group of eight tiles, in one embodiment. A local input/output may be provided to the various tiles of the plane.

Figure 1:
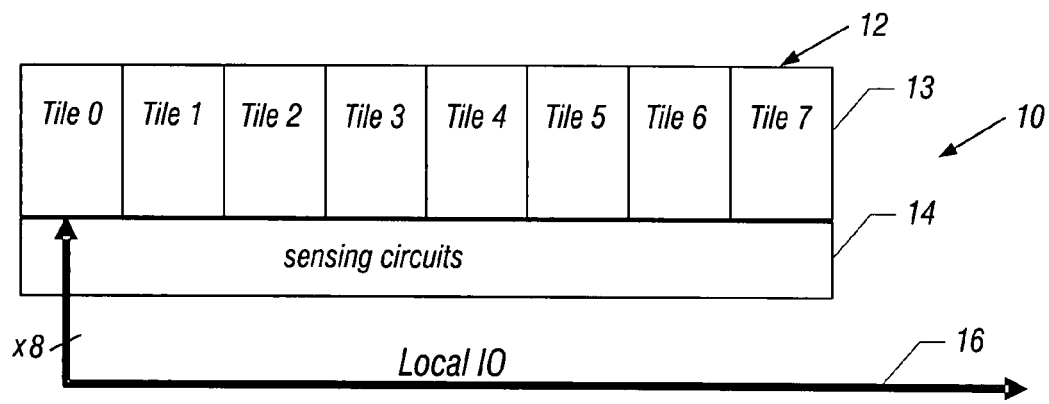
FIG. 1 is a depiction of a phase change memory plane in accordance with one embodiment of the present invention.

Thus, referring to FIG. 1, a series of tiles 13, making up a plane 12, may have a block of contiguous sensing circuits 14. The tiles 13 may be coupled to an 8 bit local input/output line 16. Thus, the eight tiles may output a total of 64 bits.

If it is desired to have more outputs than is possible with one plane, for example 128 bit outputs, two planes may be paired to provide the desired number of inputs and outputs. Two planes that are grouped together may be collectively known as a partition.

Figure 2:
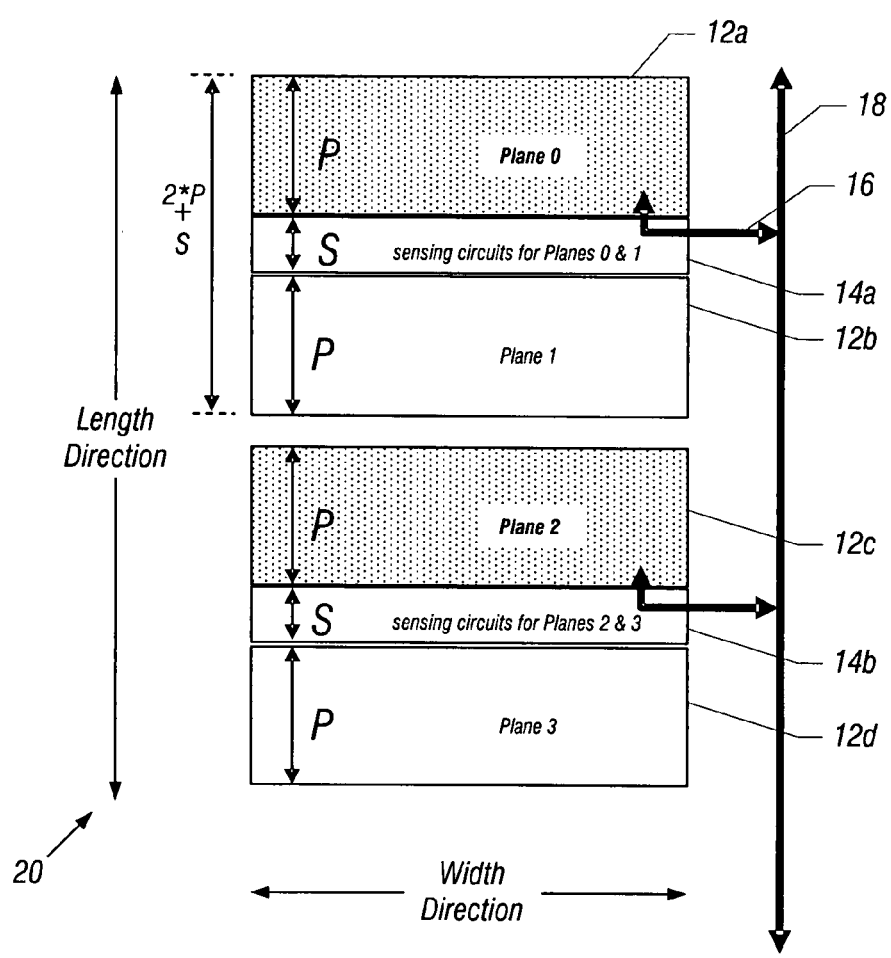
FIG. 2 is a depiction of a phase change memory interleaved architecture in accordance with one embodiment of the present invention.

Referring to FIG. 2, the planes 12a and 12b together could make up a partition. Similarly, the planes 12a and 12c could make up a partition. Likewise, the planes 12b and 12d could make up a partition. Each set of adjacent planes, such as the planes 12a and 12b, may share a block of physically contiguous sensing circuits 14 such as the circuit 14a. Particularly in the case where the partition is made up of the planes 12a and 12c, the sensing circuit 14a may be shared between the planes 12a and 12b since these two planes are never accessed at the same time.

In other words, by interleaving the planes in forming partitions, by taking two non-adjacent planes to make up a partition, two adjacent planes, such as the planes 12a and 12b, may share their sensing circuits 14a. Likewise, the planes 12c and 12d may share the sensing circuits 14b. In this embodiment, the planes 12a and 12c make up a partition which is accessed at one time to, for example, provide a 128 inputs and outputs, while the planes 12b and 12d are accessed at one time to make up the desired number of inputs and outputs.

The effect of this interleaving of planes to form partitions is illustrated by the length dimensions indicated as P and S. The length P is a length in the direction from adjacent plant-to-adjacent plane, as indicated in FIG. 2. The length S is the length of the sensing circuits for those planes. Without interleaving, the total length of the two planes, together with the sensing circuits for one partition, is two times the quantity P+S. With the interleaving arrangement, the total length of the clip is reduced by S×N/2, where N is the number of planes. Thus, a considerable savings in size may be achieved.

In addition, in some embodiments, there are high powered signals that run up the length of the chip, parallel to the main input/output bus 18. These high powered signals carry current to be driven into the arrays during program and also perform other functions. When simultaneously activated planes are adjacent, the voltage drops due to the routing resistance is at the worst case 2×I×R, where I is the current required by each plane and R is the resistance of the length of the line running up the height of the chip.

With interleaved planes, the two planes comprising a partition may be placed independently. For example, one plane may be at the top and one plane may be at the middle of the chip. In this scenario, the worst case voltage drop becomes I×R+I×R/2, which is equal to 1.5 I×R, so 25 percent of the drop may be removed. This can mean that metal lines may be made more narrow, increasing resistance and giving the same voltage drop tolerance, again reducing die size.

It is not necessary in all embodiments that the two interleaved planes be closely spaced. Instead, the planes making up a partition may be spaced by any distance which is advantageous, in some embodiments.

The present invention is not limited to phase change memories, but, rather, is applicable to any high bandwidth bit alterable crosspoint memory.

Programming of a chalcogenide to alter the state or phase of the material may be accomplished by applying voltage potentials to a lower address line and upper address line, thereby generating a voltage potential across the select device and memory element. When the voltage potential is greater than the threshold voltages of any select device and memory element, then an electrical current may flow through the chalcogenide in response to the applied voltage potentials, and may result in heating of the chalcogenide.

This heating may alter the memory state or phase of the chalcogenide. Altering the phase or state of the chalcogenide may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 3:
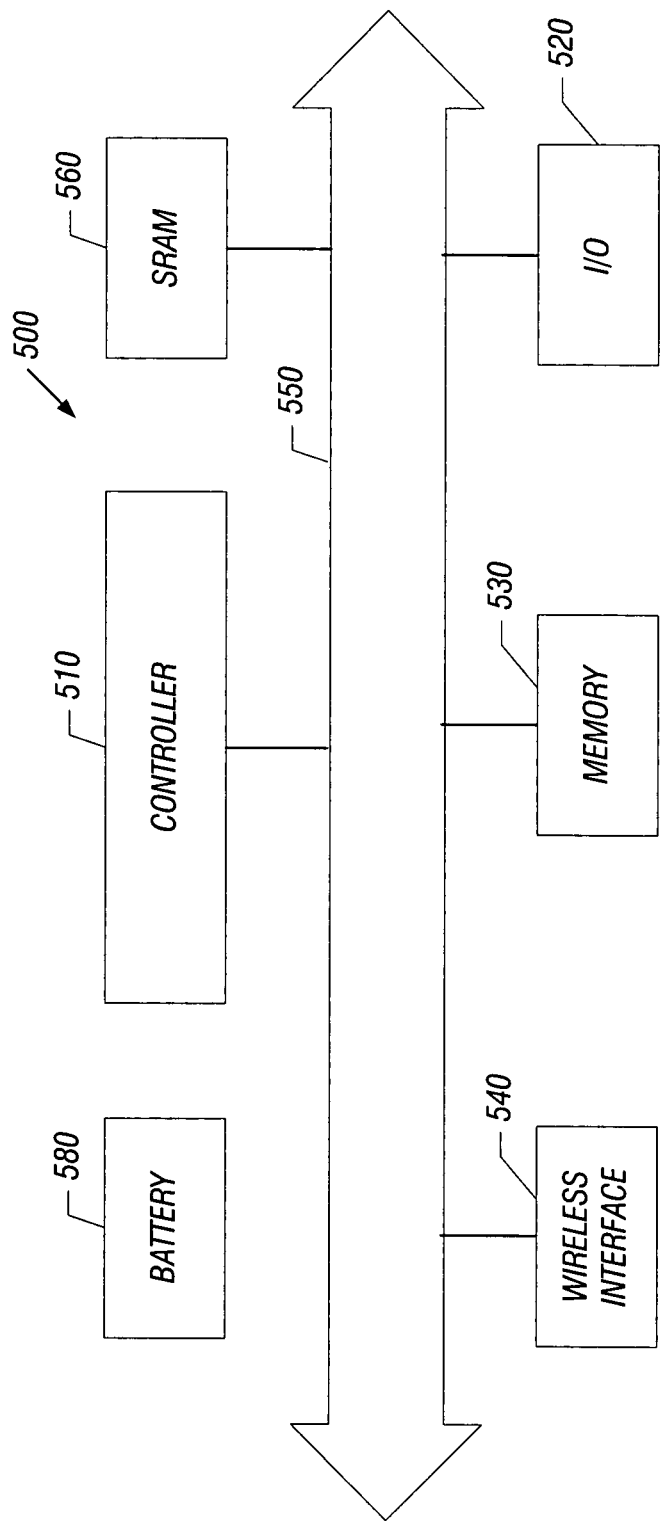
FIG. 3 is a system depiction in accordance with one embodiment.

Turning to FIG. 3, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory comprising:
    a first plane of bit alterable, crosspoint memory cells, said first plane including at least two tiles, each tile including a group of memory cells on a series of adjacent word lines and bitlines;
    a second plane of bit alterable, crosspoint memory cells, said second plane including at least two tiles, each tile including a group of memory cells on a series of adjacent word lines and bitlines;
    a single block of sensing circuits for both said first and second planes; and
    wherein said memory is of a size of two times the quantity of a length of the plane and a length of the block of sensing circuits minus a length of the block of sensing circuits times the number of planes over two.

2. The memory of claim 1 wherein said cells of said first and second planes include chalcogenide.

3. The memory of claim 1 wherein said block of sensing circuit is between said first and second planes.

4. The memory of claim 3 wherein each of said planes is accessed together with another plane other than one of said first and second planes.

5. The memory of claim 1 wherein said first and second planes are part of a partition not including the other of said first and second planes.

6. The memory of claim 1 wherein said block of sensing circuits is a contiguous block.

7. The memory of claim 6 including a plurality of tiles within each of said planes, said tiles including a plurality of cells on adjacent row lines and adjacent bitlines.

8. The memory of claim 1 wherein each of said planes includes at least two tiles.

9. The memory of claim 8 wherein each of said tiles includes at least two bitlines.

10. The memory of claim 1 wherein said memory has a worst case voltage drop of 1.5 times the current required by each plane times the resistance to the length of a power supply for the plane.

* * * * *